United States Patent
Choi et al.

(10) Patent No.: US 9,529,960 B2
(45) Date of Patent: Dec. 27, 2016

(54) PHOTOLITHOGRAPHY PATTERNING SYSTEM USING FEATURE PARAMETERS

(71) Applicant: Samsung Electronics Co., Ltd., Suwon-si (KR)

(72) Inventors: Jin Choi, Yongin-si (KR); Heung-suk Oh, Bucheon-si (KR); Sin-jeung Park, Seoul (KR); Rae-won Yi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/679,710

(22) Filed: Apr. 6, 2015

(65) Prior Publication Data

US 2015/0220679 A1    Aug. 6, 2015

Related U.S. Application Data

(62) Division of application No. 13/950,708, filed on Jul. 25, 2013, now Pat. No. 9,017,904.

(30) Foreign Application Priority Data

Aug. 9, 2012 (KR) .................. 10-2012-0087353

(51) Int. Cl.
  *G06F 17/50* (2006.01)
  *H01L 21/308* (2006.01)
  *G03F 1/00* (2012.01)
  *H01L 21/027* (2006.01)
  *G03F 7/20* (2006.01)

(52) U.S. Cl.
  CPC ............ *G06F 17/5081* (2013.01); *G03F 1/00* (2013.01); *G03F 7/70433* (2013.01); *G03F 7/70558* (2013.01); *H01L 21/027* (2013.01); *H01L 21/308* (2013.01)

(58) Field of Classification Search
  USPC ........................................... 716/51
  See application file for complete search history.

(56) References Cited

U.S. PATENT DOCUMENTS

| | | | |
|---|---|---|---|
| 6,087,046 A | 7/2000 | Nakasuji | |
| 6,670,081 B2 | 12/2003 | Laidig et al. | 430/5 |
| 7,453,063 B2 | 11/2008 | Ottens et al. | 250/306 |
| 7,759,027 B2 | 7/2010 | Fujimura et al. | 430/5 |
| 8,017,288 B2 | 9/2011 | Fujimura et al. | |
| 8,034,544 B2 | 10/2011 | Yune | |
| 8,039,176 B2 | 10/2011 | Fujimura et al. | |
| 8,112,725 B2 | 2/2012 | Tsutsui | |

(Continued)

FOREIGN PATENT DOCUMENTS

| | | |
|---|---|---|
| JP | 2004-153032 | 5/2004 |
| JP | 2008-216608 | 9/2008 |

(Continued)

*Primary Examiner* — Mohammed Alam
(74) *Attorney, Agent, or Firm* — Myers Bigel, P.A.

(57) ABSTRACT

A method of providing a photolithography pattern can be provided by identifying at least one weak feature from among a plurality of features included in a photolithography pattern based on a feature parameter that is compared to a predetermined identification threshold value for the feature parameter. A first region of the weak feature can be classified as a first dosage region and a second region of the weak feature can be classified as a second dosage region. Related methods and apparatus are also disclosed.

8 Claims, 14 Drawing Sheets

(56) References Cited

U.S. PATENT DOCUMENTS

| | | | |
|---|---|---|---|
| 2001/0031406 A1 | 10/2001 | Masuyuki | |
| 2002/0028393 A1* | 3/2002 | Laidig | G03F 1/144 430/5 |
| 2007/0028205 A1* | 2/2007 | Nakano | G06F 17/5068 438/15 |
| 2009/0187878 A1* | 7/2009 | Ogino | B82Y 10/00 716/55 |
| 2010/0251202 A1* | 9/2010 | Pierrat | G03F 1/36 716/50 |
| 2011/0053096 A1 | 3/2011 | Yu et al. | |
| 2011/0226970 A1* | 9/2011 | Krecinic | G03F 7/70291 250/492.22 |
| 2012/0051622 A1* | 3/2012 | Gyoda | G03F 7/705 382/144 |

FOREIGN PATENT DOCUMENTS

| | | |
|---|---|---|
| JP | 2011-049296 | 3/2011 |
| KR | 10-2006-0032542 A | 4/2006 |
| KR | 10-2007-0098011 A | 10/2007 |
| KR | 10-2010-0046468 A | 5/2010 |

* cited by examiner

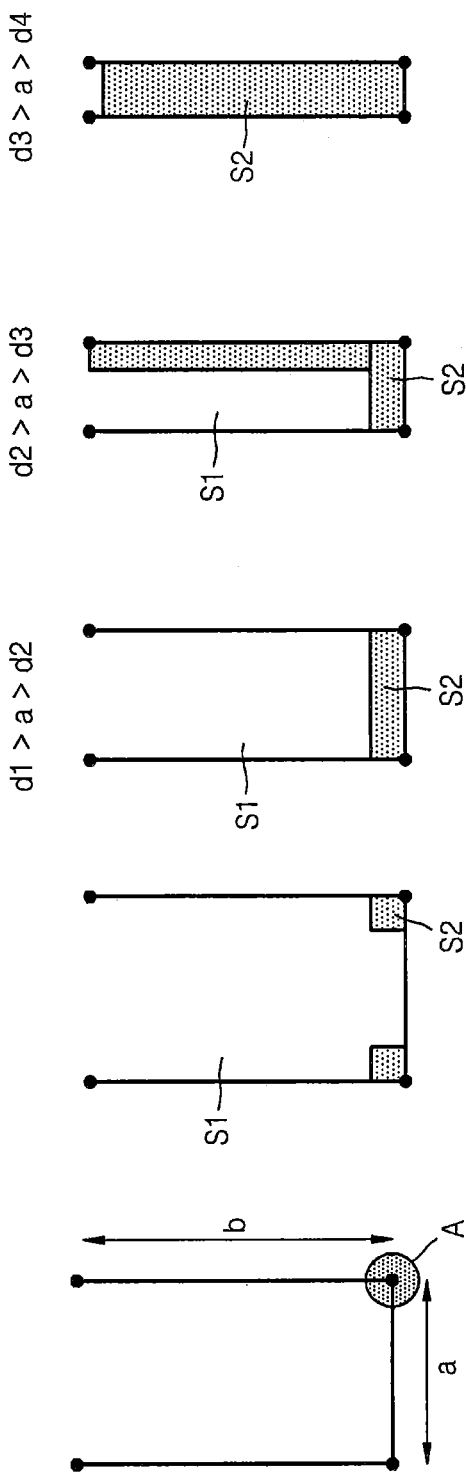

PHOTOLITHOGRAPHY PATTERNING SYSTEM USING FEATURE PARAMETERS

CROSS-REFERENCE TO RELATED APPLICATIONS

This application is a divisional of U.S. patent application Ser. No. 13/950,708, filed Jul. 25, 2013 and claims priority from Korean Patent Application No. 10-2012-0087353, filed on Aug. 9, 2012, in the Korean Intellectual Property Office, the disclosure of which is incorporated herein by reference in its entirety.

FIELD

The inventive concept relates to the field of photolithography, and more particularly, to photolithography for semiconductor fabrication.

BACKGROUND

In order to integrate as many devices as possible in a small area, the size of individual devices should be reduced, and, for this purpose, the pitch between the patterns should be reduced. Due to the resolution limitations of the related photolithography processes, there may be difficulties in forming patterns according to some design rules of the reduced pitch semiconductor devices.

SUMMARY

Embodiments according to the inventive concept can include methods of providing photolithography patterns using feature parameters, systems and computer program products that implement such methods. Pursuant to these embodiments, a method of providing a photolithography pattern can be provided by identifying at least one weak feature from among a plurality of features included in a photolithography pattern based on a feature parameter that is compared to a predetermined identification threshold value for the feature parameter. A first region of the weak feature can be classified as a first dosage region and a second region of the weak feature can be classified as a second dosage region.

BRIEF DESCRIPTION OF THE DRAWINGS

Exemplary embodiments of the inventive concept will be more clearly understood from the following detailed description taken in conjunction with the accompanying drawings in which:

FIGS. 10A through 10E are drawings illustrating guidelines for classifying shot regions with respect to detected weak patterns;

DESCRIPTION OF THE EMBODIMENT ACCORDING TO THE INVENTIVE CONCEPT

Figure 1:
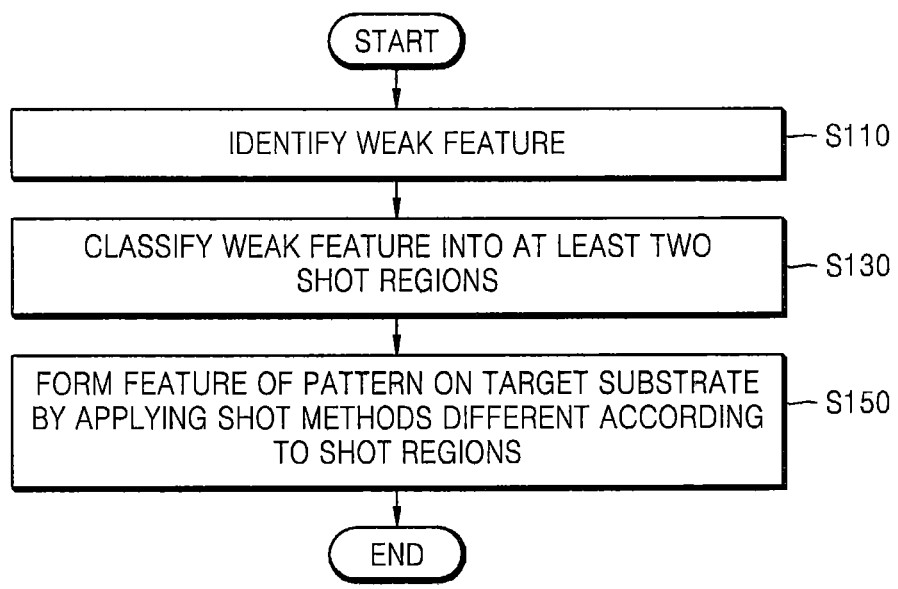
FIG. 1 is a flowchart showing a patterning method according to some embodiments of the present inventive concept.

The present inventive concept is described herein with reference to the accompanying drawings, in which exemplary embodiments of the present invention are shown. This invention may, however, be embodied in many different forms and should not construed as limited to the exemplary embodiments set forth herein. Rather, these embodiments are provided so that this disclosure will be thorough and complete, and will fully convey the scope of the invention to those of ordinary skill in the art.

It will be understood that when an element or layer is referred to as being "connected to" another element or layer, the element or layer may be directly connected to another element or layer or intervening a third element or layer. Furthermore, when an element is referred to as being "on" another element or layer, the element or layer may be "directly on" or intervening a third element or layer. In the drawings, lengths and sizes of layers and regions may be exaggerated for clarity and elements that are not related to the description are removed. Also, like reference numerals refer to like elements throughout. The terminology used herein is for the purpose of describing particular embodiments only and is not intended to be limiting of the invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure.

As used herein, the term "and/or" includes any and all combinations of one or more of the associated listed items.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Many different embodiments are disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

FIG. 1 is a flowchart showing a patterning method according to some embodiments of the present invention.

Referring to FIG. 1, of patterns to be formed on a target substrate, weak patterns may have a high possibility of failure are detected (S110). The target substrate may be a mask used in photolithography process or may be a semiconductor substrate on which semiconductor devices are formed.

The semiconductor substrate may be a semiconductor wafer, for example, may include a group IV material or a group III-V compound. The semiconductor substrate may be formed to be a mono-crystal wafer such as a silicon mono-crystal. The semiconductor substrate is not limited to a mono-crystal wafer, as various wafers, such as an epi or epitaxial wafer, a polished wafer, an annealed wafer, a silicon-on-insulator (SOI), may be used. Here, the epitaxial wafer refers to a wafer obtained by growing a crystalline material on a mono-crystal silicon substrate.

A photomask is an element used to form patterns on a semiconductor substrate through a photolithography process in a semiconductor device manufacturing process. Generally, a base plate is formed of quartz material having a thin chrome film thereon (referred to as a blank mask) The mask can be completed when the blank mask is patterned using a laser or an e-beam. In the case of e-beam lithography process, there may be difficulties in providing minute patterning because a high sensitive resist may be used.

The blank mask may be classified as two kinds, that is, a binary mask (BIM) and a phase shift mask (PSM) according to the presence of a transparent film that may be referred to as a "phase conversion film". The phase conversion film included in the PSM can reduce light from an exposure apparatus. As a further minute pattern may be used in a highly integrated semiconductor apparatus, the PSM that reduces intensity of light may be used for forming a high resolution minute circuit pattern.

As appreciated by the present inventors, patterns that have features with a pattern relatively probability of failure may be detected by using various methods, for example, by modeling or a predetermined rule. The weak features can be detected by using an inclination of the pattern separated via a convolution integral of a designed pattern and a modeled pattern. In some embodiments, weak features can be detected by using predetermined rules according to a distance between vertexes adjacent to each other in the features or according to the number of vertexes included in a unit area. An identification threshold can be used to distinguish which patterns are weak and those that are not considered weak.

After detecting weak features, the detected weak features can be classified as at least two shot regions (S130). The classifying of the weak features as at least two shot regions may be performed by various methods. In some embodiments, classifying the weak features as at least two shot regions can be provided by classifying based on the distance between vertexes in the weak features. For example, a quadrangle or triangle shape (ie., portion of the pattern) adjacent to each of vertexes, or a quadrangle shape extending along a side that connects two vertexes may be classified as a second shot region, and a remaining region may be classified as a first shot region. In some embodiments, all of the weak features may be classified as the second shot region. Here, the first shot region may be understood as a region on which an exposure is performed by a single shot, and the second shot region may be understood as a region on which an exposure is performed by specific shots, such as an overlap shot that at least partially overlaps the first shot region. The classifications and type of the shot regions will be described in detail with reference to FIG. 10A through 11E using a classification threshold in some embodiments.

After classifying the shot regions, patterns are formed on a target substrate by performing exposures by applying different shot to the classified shot regions (S150). In some embodiments, shots may be, as described above, overlapping shots or shots where dosage may be varied amount.

In the patterning method according to an embodiment of the present invention, weak features of patterns to be designed are detected and are classified as at least two shot regions. Then, the shot regions are exposed by applying different shot methods, for example, by performing overlapping shots or by controlling the dosage of the shot. Therefore, the failure of patterns may be reduced while maintaining process stability. For example, overlapping shots may address line edge roughness (LER), line end shortening, and minimum resolution, etc., which may increase process stability.

Figure 2:
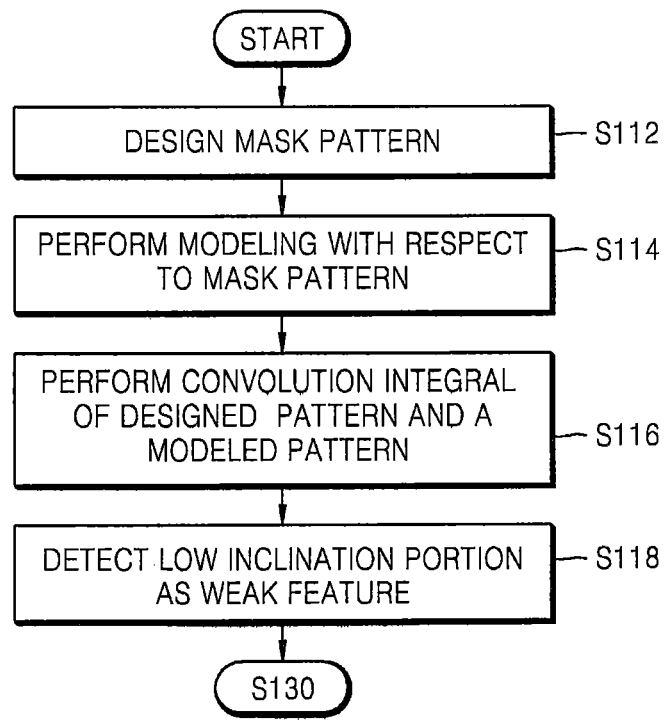
FIG. 2 is a flowchart showing operation of detecting weak patterns of FIG. 1, according to some embodiments of the present inventive concept.

FIG. 2 is a flowchart showing the operation of detecting weak features (S110) of FIG. 1, according to some embodiments of the present inventive concept.

Referring to FIG. 2, a pattern of a mask to be formed is designed (S112). That is, a pattern to be formed on the mask is designed based on the pattern to be formed on a semiconductor substrate. In some embodiments, the pattern is formed using a computer software package.

Next, a modeling with respect to the mask pattern is performed (S114). It will be understood that the modeling can be provided by calculating a difference in the shape of the mask pattern compared to the shape that is transferred onto a wafer using the mask pattern using simulation. The simulation can be performed using models set with respect to various shapes features found in the mask which can be prepared in advance, whereupon the mask pattern can be compensated or modeled based on the calculation result.

A convolution integral of a designed pattern and a modeled pattern is performed (S116). The convolution integral is a mathematical concept that is generally known to those of ordinary skill in the art, and thus, the description thereof is omitted. An inclination is measured with respect to a shape obtained as a result of the convolution integral and regions that have low inclination may be detected as weak features (S118). Low inclination can indicate that many deformations may occur at the corresponding feature, and since there is a high probability that the deformation may cause a pattern failure, the regions that have an associated low inclination, can be detected as weak features.

Figure 3:
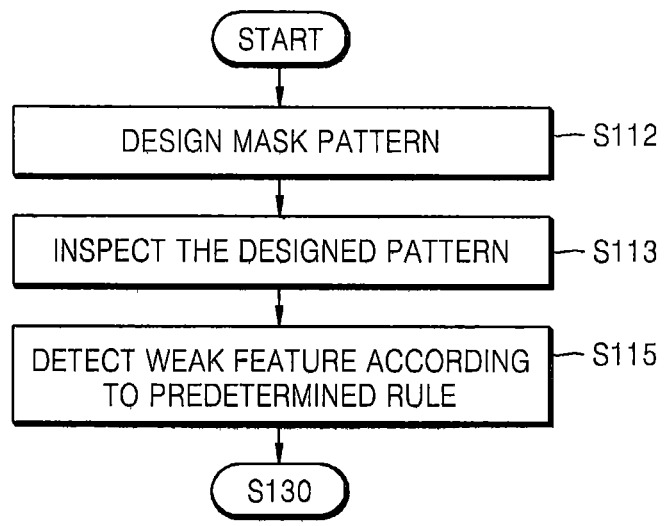
FIG. 3 is a flowchart showing operations of detecting weak patterns according to some embodiments of the present inventive concept.

FIG. 3 is a flowchart showing operations of detecting weak features with respect to the operation of detecting weak features (S110), according to some embodiments of the present inventive concept.

Referring to FIG. 3, first, a mask pattern to be formed is designed (S112). Next, an inspection of the features in the designed pattern is performed (S113). For example, the inspection includes inspection of shapes of the features and vertexes included in each of the features, and also, inspection of distances between adjacent vertexes. The shapes and the distances between the vertexes may be extracted from data of the designed pattern.

Weak features are detected by applying predetermined rules with respect to the inspected pattern (S115). Features that include vertexes corresponding to the case, for example, when a distance between adjacent vertexes is less than an identification threshold may be identified as weak features. As another example when the number of vertexes per unit area is equal to or greater than the identification threshold, the corresponding features may be identified as weak features.

Although methods of identifying weak features in relation to a mask pattern are described with reference to FIGS. 2 and 3. Weak features may also be identified when features are formed on a semiconductor substrate by using a laser or an e-beam.

Figure 4A:
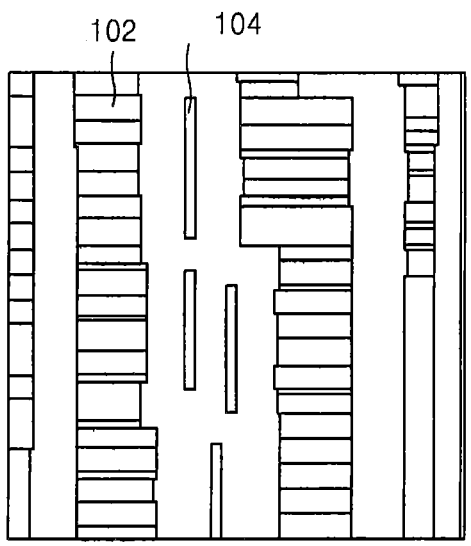
FIGS. 4A through 4C are comparative plan views illustrating effects of the patterning methods.
Figure 4B:
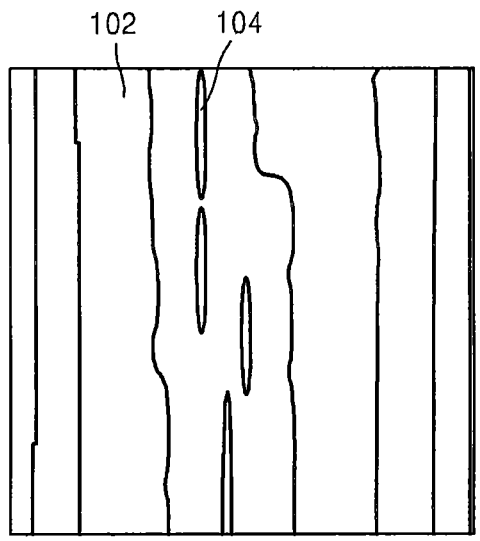
Figure 4C:
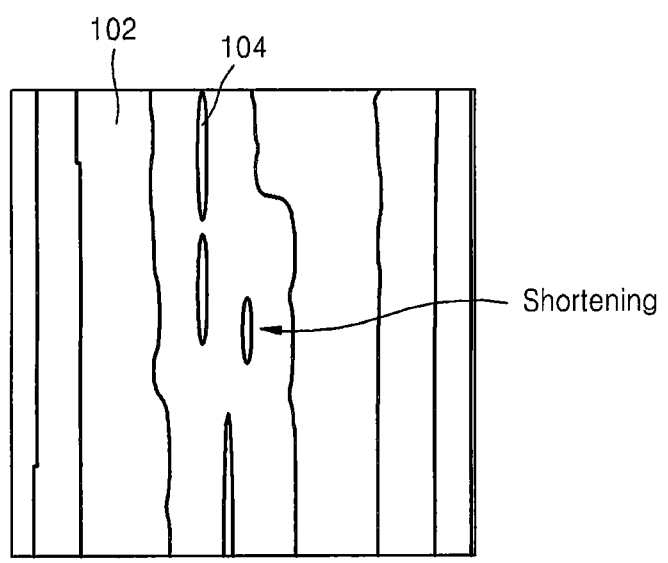

FIGS. 4A through 4C are plan views for explaining an effect of the patterning method according to some embodiments of the present invention. FIG. 4A is a plan view showing a designed pattern to be formed on a mask, FIG. 4B is a plan view showing a pattern actually formed on a mask by using overlapping shots, and FIG. 4C is a plan view showing a pattern actually formed on a mask without overlapping shot, as a comparative example.

Referring to FIG. 4A, as described above, FIG. 4A shows a designed pattern with respect to a pattern to be formed on a mask. The pattern having a relatively wide width may include main features 102, and patterns having a relatively narrow width may be assist features 104. The assist features 104 may include a scattering bar SB and/or an anti-scattering bar ASB.

Referring to FIG. 4B, it is seen that patterns practically formed by overlapping shots may be similar to the designed pattern of FIG. 4A. That is, the pattern formed on the mask may be similar to the designed pattern except that vertically contacting edge portions may be slightly curved and both edges of long axes of the assist features 104 may be rounded.

Referring to FIG. 4C, as indicated by an arrow, when overlapping shots are not applied, the assist features 104 may be shortened, which can cause pattern failure. Pattern failure may be caused because an incorrect shot is performed due to the small size of the assist features 104 or an insufficient dosage is irradiated onto the corresponding regions.

Accordingly, in the patterning method according to the current embodiments, shot regions can distinguished with respect to weak features to which pattern failure may occur, and overlapping shots may be performed on those regions where pattern failures may occur. Instead of overlapping shots, a method of controlling dosage according to the shot regions may be applied. For example, a shot with a high dose is performed on regions where pattern failures occur, and a shot with a regular or reduced dose may be performed on remaining regions.

Figure 5A:
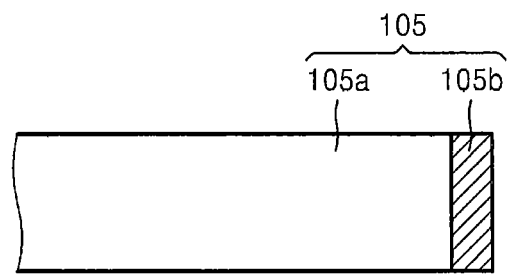
FIG. 5A is a drawing of a pattern illustrating a principle of the patterning method according to some embodiments of the present inventive concept.
Figure 5B:
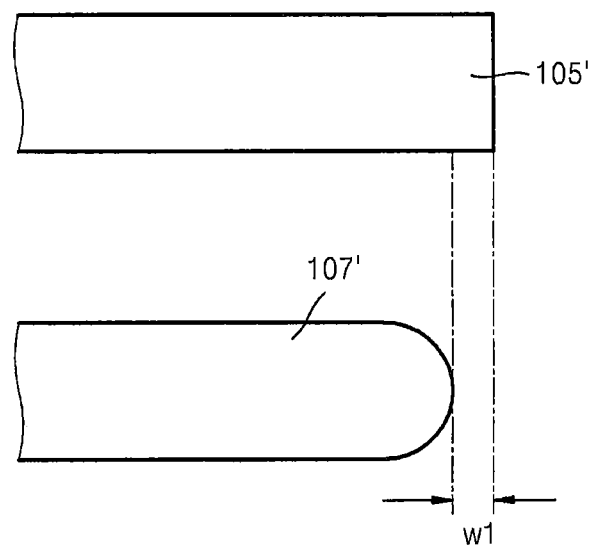
FIG. 5B is a drawing of a pattern formed using a conventional patterning method.

FIG. 5A is a drawing illustrating a patterning method according to some embodiments of the present invention, and FIG. 5B is a drawing illustrating a conventional patterning as a comparative example.

Referring to FIG. 5A, the upper feature is a designed feature 105 to be formed on a mask, and the lower pattern is a practical feature 107 actually formed on the mask. The designed feature 105 may be classified as two regions (or portions), that is, a first shot region 105a onto which a single shot is performed and a second shot region 105b onto which at least two shots are performed.

The dosage irradiated onto the second shot region 105b may be increased since at least two shots are performed in the second shot region 105b. It will be understood that the dosage may be controlled by overlapping shots or by varying the dosage in a single shot. Accordingly, as it is depicted in FIG. 5A, that the practical feature 107 having the same shape as the designed pattern 105 may be formed. It will be understood that, a rounding phenomenon at the edge may still remain as shown. In regard to the rounding phenomenon, a method of adding a serif compensation feature on the edge portion of the pattern or a method of performing shots more than three times on the two vertexes may be considered.

Referring to FIG. 5B, the upper feature is a designed feature 105' to be formed on a mask, and the lower feature is practical feature 107' actually formed on the mask. In the case when the designed feature 105' is exposed by a single shot without distinguishing regions, as depicted in FIG. 5B, a pattern failure of reducing edge may occur. For example, the practical feature 107' has a length shorter by as much as a first width w1 than the length of the designed feature 105'. In this way, the reduced length of the practical feature 107' may cause a mask pattern failure and/or a pattern failure of a semiconductor substrate.

Figure 6A:
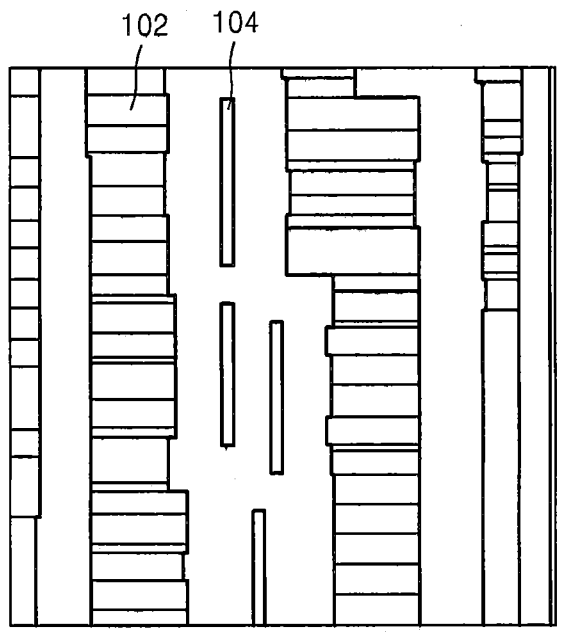
FIGS. 6A and 6B are plan views for explaining an application range of the patterning method according to some embodiments of the present inventive concept.
Figure 6B:
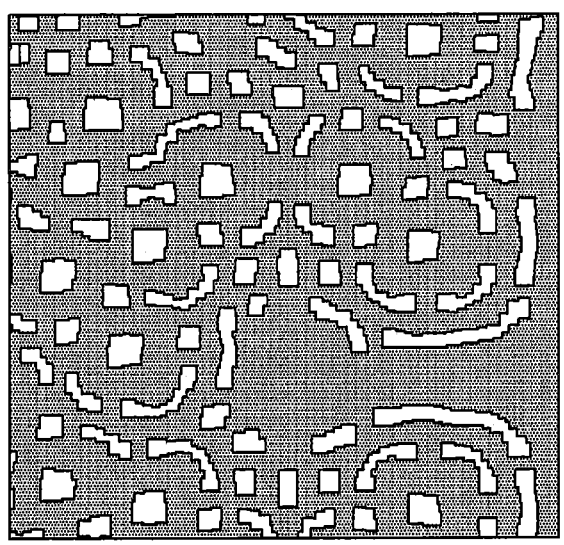

FIGS. 6A and 6B are plan views for explaining an application range of the patterning method according to some embodiments of the present invention.

Referring to FIG. 6A, features to be formed on a mask or a semiconductor substrate may be largely classified as main features 102 and assist features 104. Generally, the pattern failure can occur in the assist features 104 due to the smaller size. As depicted in FIG. 6A, in the case of a simple pattern, overlapping shots or a controlled dosage may be applied to the assist features. Accordingly, a patterning process may be relatively readily performed.

Referring to FIG. 6B, features to be formed on a mask or a semiconductor substrate may not be clearly designated as main or assist features and may have complicated shapes. In the case of a complicated pattern, many pattern failures can occur. As appreciated by the present inventors, it may be difficult to predict which feature may cause a pattern failure. A method to correctly detect weak features regardless of the complexity of the pattern may be advantageous.

In some embodiments, the methods described with reference to FIGS. 2 and 3 may be used to identify weak features. When a feature is not complicated but should be high quality, a pattern failure may occur in main features. In this case, even in a simple pattern, it weakness of a main features may need to be identified.

Figure 7:
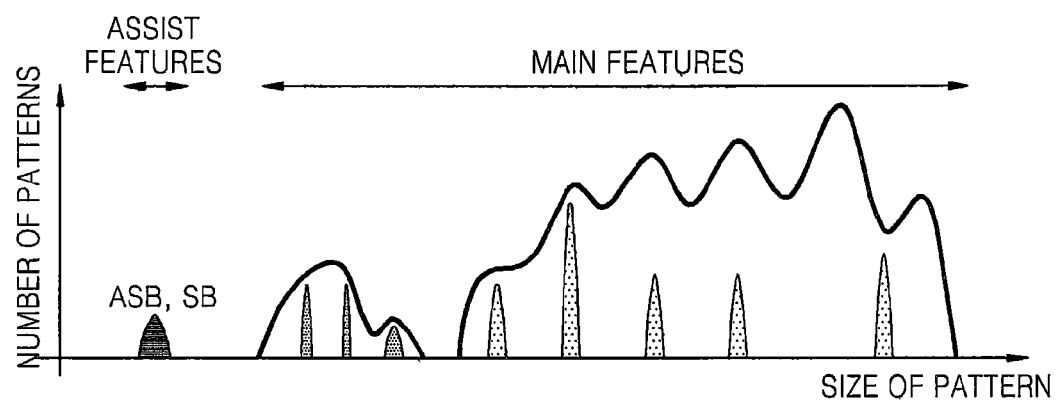
FIG. 7 is a graph showing the number of assist features and main features formed on a mask.

FIG. 7 is a graph showing the number of assist features and main features formed on a mask and the possibility of generating quality failure. Here, a x axis indicates the size of features, and an y axis indicates the number of features corresponding to the sizes in a mask. The higher hatching concentration indicates higher possibility of generating a pattern failure.

Referring to FIG. 7, as it is seen from the graph, many features having a relatively large size are formed in the mask, and fewer features having a small size, for example, ASB or SB are formed. Also, as indicated by arrows, relatively large size features are main features, and relatively small size features are assist features.

When the hatching concentration is considered, it is seen that many pattern failures can occur in small size features, for example, assist features. However, it is seen that the pattern failures may also occur in the relatively small main features, and also, in the case of the large size main features, such that large size main features may also have a pattern failure.

In this way, since the occurrence of pattern failures may not be limited to the small size features, but in all range of sizes, there may be a limit in identifying weak features only based on the size of patterns. In particular, in the case of a complicated pattern as depicted in FIG. 6B, the possibility of generating the pattern failure may be high in the main features and irregular patterns.

Figure 8A:
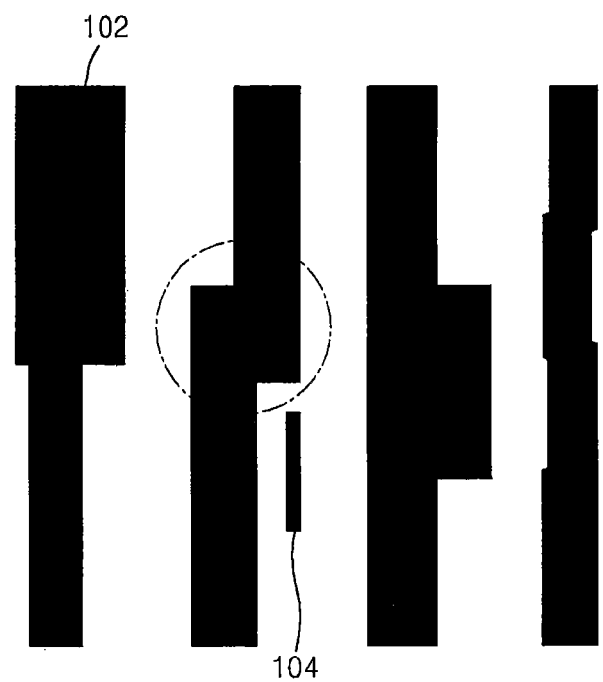
FIGS. 8A through 8C are drawings illustrating weak pattern detecting methods applied to a patterning method according to some embodiments of the present inventive concept.
Figure 8B:
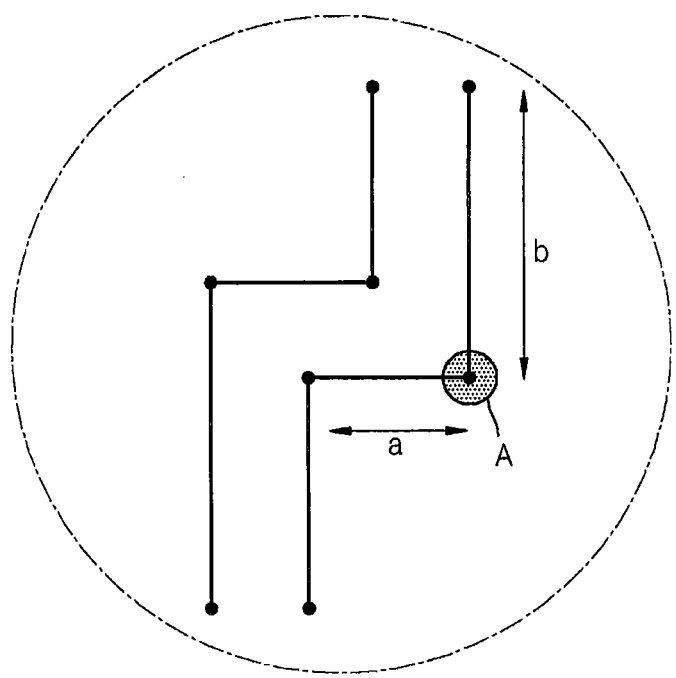
Figure 8C:
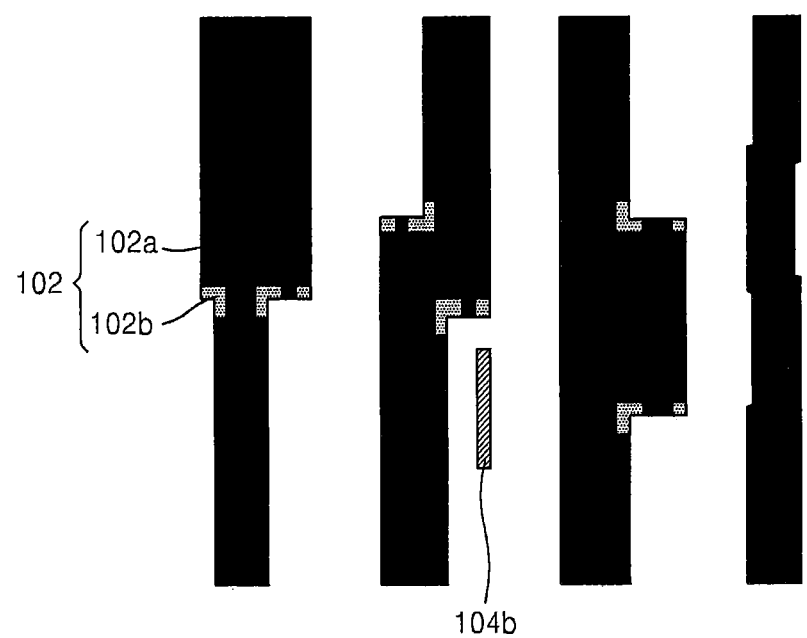

FIGS. 8A through 8C are conceptual drawings for explaining another weak pattern detecting method that is applied to a patterning method according to an embodiment of the present invention.

Referring to FIGS. 8A through 8C, FIG. 8A shows a pattern including features to be formed. A feature can be identified as being weak, when a distance between adjacent vertexes in the feature is less than a reference distance. Reference numeral 102 indicates a main feature and reference numeral 104 indicates an assist feature.

More specifically, when vertexes (such as a corner) are extracted from a feature that is located second from the left side of the figure, the vertexes may have a structure as depicted in FIG. 8B. In this vertex structure, when a distance to an adjacent vertex from one of the vertexes as a basis, for example, the vertex in a portion A hatched by a circle, that is, a distance a to a vertex in a horizontal direction and a distance b to a vertex in a vertical direction are less than reference distances, the corresponding feature may be identified as a weak feature. The reference distances may be in a range from about 10 nm to about 60 nm. For example, when a high patterning quality is desired, the reference may be set to about 10 nm, whereas when regular patterning quality is desired, the reference may be set to about 60 nm.

FIG. 8C shows regions to which an overlap shot can be applied or a large amount of dose can be applied after identifying a weak feature. That is, the black portion can be designated as a first shot region 102a onto which a single shot is performed or a shot with a regular dosage is performed, and the portions hatched by dots may be second shot regions 102b onto which at least two shots (such as the first shot and a second shot) are performed or a shot with a large dosage is performed. In the case of the assist features 104, the assist features 104 may correspond to mostly weak patterns since widths of the patterns may be very small, and are classified as the second shot region 104b to which an overlap shot is performed or a shot with a large dosage is performed with respect to entire assist features 104 according to a predetermined rule.

After identifying weak features, rules for classifying a predetermined portion of a weak pattern as an overlap shot region are described in further detail with reference to FIGS. 10A through 11E.

Figure 9:
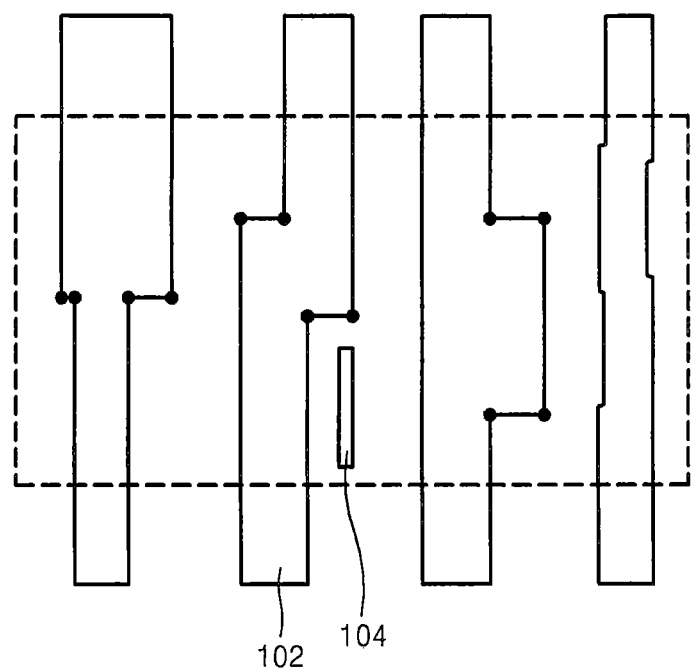
FIG. 9 is a drawing illustrating weak pattern detecting methods applied to a patterning method according to some embodiments of the present inventive concept.

FIG. 9 is a drawing explaining some methods of identifying weak features applied to the patterning method according to some embodiments of the present invention.

Referring to FIG. 9, in the patterning method according to the current embodiment, weak features can be determined according to whether the number of vertexes per unit area is greater than a predetermined number or not. For example, when there is a pattern as depicted in FIG. 9, the number of vertexes included in a unit area as indicated by the dotted line is calculated. Afterwards, whether the feature is weak or not is determined based on whether the calculated number of the vertexes is greater than a reference number (i.e., a threshold) or not.

It will be understood that, in the present embodiment, the unit area over which the number for vertexes is determined can be treated as a feature so that the identification of the feature as weak lead to a subsequent classification of that feature. Accordingly, it will be understood that term "feature" can include both an individual feature as well as a group of individual features that are treated, as one feature.

In some embodiments according to the inventive concept, the number of vertexes of the rightmost main feature may not be included in the determination of a weak feature. Also, most of the assist features 104 may be weak features because the size of the assist features 104 is small, and thus, vertexes of the assist features 104 may be not included in the determination of a weak feature. Additionally, the unit area may have an arbitrary shape or size according to the user, and the reference number of vertexes may also be arbitrarily determined. For example, the unit area may be 5×5 $\mu m^2$, and the reference number may be greater than 1000 vertexes.

In the case when the weak features are detected by the number of vertexes per unit area, the rule to classify the weak features as shot regions may be the same as the rule for classifying shot regions with respect to the weak patterns detected according to the distance between adjacent vertexes. In some embodiments according to the inventive concept, other shot region classifying methods may be applied.

FIGS. 10A through 10E are drawings illustrating rules for classifying shot regions with respect to identifying weak features.

FIG. 10A shows a portion of a feature identified as a weak in which vertexes and lines that connect the vertexes are shown. Here, when the vertex in a portion A hatched in a circle is a reference vertex, a first distance between the vertexes adjacent in a horizontal direction may be (a) and a second distance between the vertexes adjacent in a vertical direction may be (b).

It will be understood that a classification threshold can be used to determine how identified weak features are to be processed. For example, in some embodiments, when the threshold is a first value, the weak feature can be classified a particular way based on a comparison of the distance to the first vertex. When, however, the threshold is a second value, a different classification can be used for the same distance to the first vertex.

Referring to FIG. 10B, when the first distance a is greater than a first reference distance d1 (sometimes referred to herein as a classification threshold value), the problem of reducing an edge portion does not occur. In this case, an overlap shot may be performed onto the vertexes. Accordingly, when the first distance a is greater than a first reference distance d1, portions of the pattern close to the vertexes may be classified as a region to which an overlap shot or a shot with a large dosage is provided, that is, a second shot region S2, and remaining portions of the pattern may be classified as a region to which a single shot is performed, that is, a first shot region S1. The second shot region S2 may have a rectangular shape. Also, the second shot region S2 may be defined as a shape different from the rectangular shape. For reference, the phenomenon of rounding of the edge portion of the pattern may be mitigated to some degree by applying a overlap shot onto the vertexes. The first reference distance d1 may be arbitrary determined by the user. For example, the first reference distance d1 may be 200 nm.

Referring to FIG. 10C, since the problem of reducing an edge portion occurs when the first distance a is smaller than the first reference distance d1, a single overlap shot may be performed on one big region instead of respectively performing overlap shots on two vertexes. Accordingly, when the first distance a is smaller than the first reference distance d1 and is greater than the second reference distance d2, the second shot region S2 may have an extended rectangular shape that connects two vertexes. Also, the second shot region S2 may be defined as a shape different from the rectangular shape. The second reference distance d2 may also be arbitrary determined by the user, for example, may be 80 nm.

Referring to FIG. 10D, when the first distance a is smaller than the second reference distance d2 and is greater than a third reference distance d3, the second shot region S2 may include an extended rectangular shape that connects the two lower vertexes and an extended rectangular shape that connects one of vertexes on either sides, for example, from the vertex of a lower right side to the vertex in a vertical direction.

When a distance between two vertexes is short, a pattern failure, that is, a line edge roughness (LER) may occur on sides adjacent to each other. Therefore, the pattern failure may be minimized by performing an overlap shot or a shot with a large amount of dose on the sides. Also, the second shot region S2 may be defined as a shape different from the shapes depicted in the drawings. The third reference distance d3 may also be arbitrary determined by the user, for example, may be 60 nm.

Referring to FIG. 10E, when the first distance a is smaller than the third reference distance d3 and is greater than a fourth reference distance d4, the entire pattern may be classified as a second shot region S2. Accordingly, an overlap shot or a shot with a large amount of dose may be performed with respect to the entire pattern. The fourth reference may also be arbitrary determined by the user, for example, may be 50 nm.

Up to now, numeral values about the first through fourth reference distances are described. However, the d numeral values are exemplary, and thus, may be modified by the user. Also, up to now, the description is made with referring to the first distance a. However, a similar rule may be applied to the second distance b, and also, the division of shot regions may be performed in consideration of both the first and second distances a and b together.

As described above, any number of classification threshold values (i.e., one or more than one) may be established to determine how a particular weak feature should be classified, and therefore subjected to varying shapes, dosages, and numbers of single and/or overlapping shots based on the distance measured between the vertexes compared to the classification threshold(s).

FIGS. 11A through 11E are drawings illustrating regions to which another type of overlapping shots are applied, according to some embodiments of the present invention.

Figure 11A:
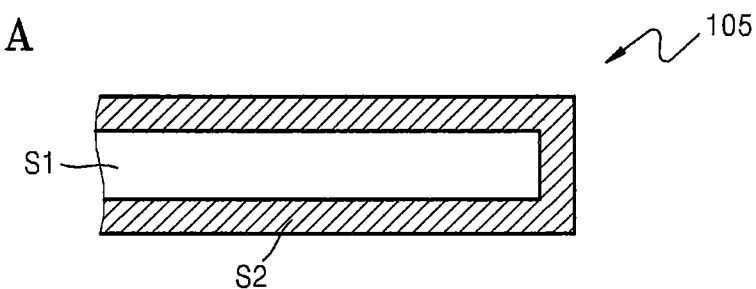
FIGS. 11A through 11E are drawings illustrating regions to which overlapping shots may be applied, according to some embodiments of the present inventive concept.

Referring to FIG. 11A, as depicted in FIG. 11A, the identified weak feature 105 may be classified as including a first shot region S1 which is a center region of the weak feature 105 and a second shot region S2 that surrounds the first shot region S1.

Figure 11B:
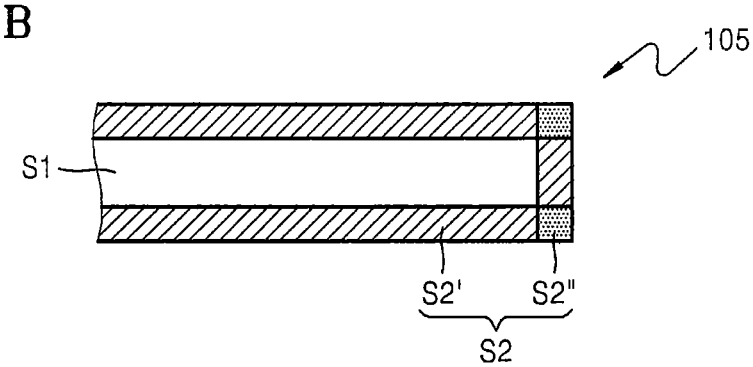

Referring to FIG. 11B, the identified weak feature 105, similar to the weak feature of FIG. 11A, may be classified as including a first shot region S1, which is a center region of the weak feature 105 and a second shot region S2 that surrounds the first shot region S1. However, the second shot region S2 may be classified as second-1 shot regions S2' and second-2 shot regions S2". For example, the second-1 shot regions S2' may be regions to which two times of shots are performed and the second-2 shot regions S2" may be regions to which three shots are performed. Accordingly, a large dosage can be provided to the vertexes at the edges of the future in consideration of a further numbers of pattern failures occurring on the vertexes at the edges of the feature. In the current embodiment, the numbers of shots are exemplary. Accordingly, the user may allocate various numbers of shots according to the classified shot regions.

Figure 11C:
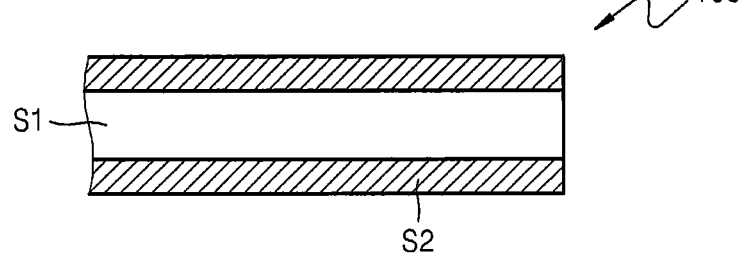

Referring to FIG. 11C, the identified weak feature 105 is classified to include a first shot region S1 and second shot regions S2. However, the second shot regions S2 are not allocated on a right edge of the first shot region S1 but may have a rectangular shape extending along both sides of the first shot region S1. If the second shot regions S2 are allocated as described above, this case may correspond to a case that a large LER occurs on the sides of a formed pattern when the pattern is formed through a single shot.

Figure 11D:
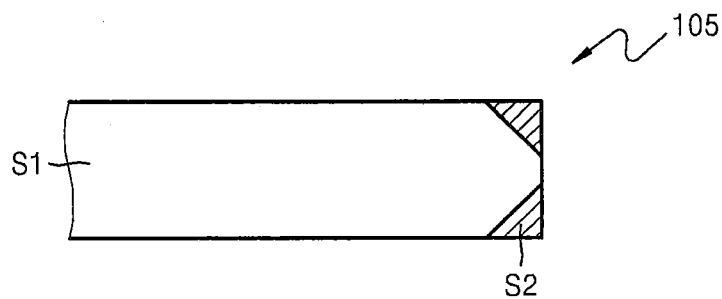

Referring to FIG. 11D, in the identified weak feature 105, like in the pattern of FIG. 10B, second shot regions S2 are allocated close to corresponding vertexes. However, the shape of the second shot regions S2 is a triangle shape not a rectangular shape. However, the shape of the second shot regions S2 is not limited to a triangle shape or a rectangular shape adjacent to the corresponding vertexes. For example, the second shot regions S2 may be defined as a various shapes, such as a circle, an oval, or another angle shape.

Figure 11E:
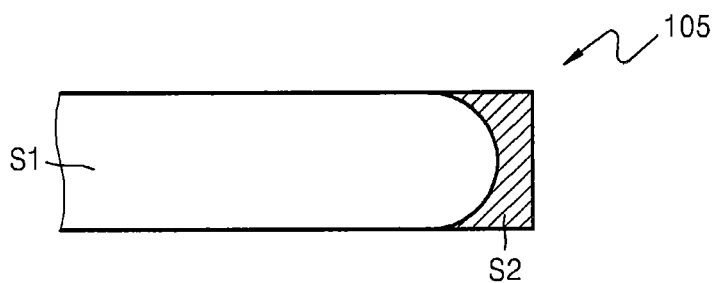

Referring to FIG. 11E, in the identified weak feature 105, like in the pattern of FIG. 10C, the second shot region S2 is allocated on an edge portion of the pattern. However, unlike in the pattern of FIG. 10C, the second shot region S2 may have a curved shape that surrounds an edge of the first shot region S1. In other words, the edge portion of the first shot region S1 that contacts the second shot region S2 may have a curved shape.

Up to now, various types of the first shot region S1 and the second shot regions S2 are described. However, the shot regions according to the present embodiments are not limited thereto, that is, the second shot regions S2 may be allocated to any shape to reduce the occurrence of pattern failures.

Figure 12:
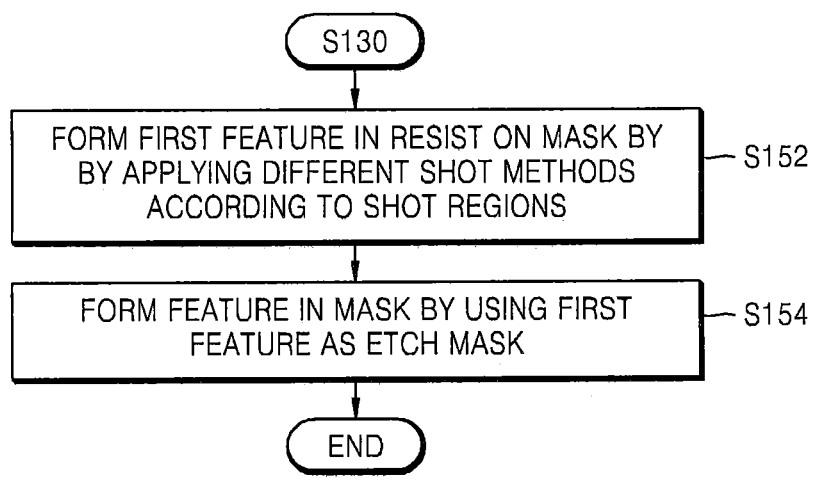
FIG. 12 is a flowchart illustrating forming a pattern on a target substrate of FIG. 1 when the target substrate is a mask.

FIG. 12 is a flowchart further showing the formation of a pattern on a target substrate (S150) of FIG. 1 when the target substrate is a mask.

Referring to FIG. 12, first, a first feature is formed in a resist on a mask by applying shot methods different according to the shot regions (S152). As described above, the shot methods different according to the shot regions denotes performing an overlap shot or shots with different dosages. The resist may be, for example, for performing a laser or an e-beam lithography. In the current embodiment, the resist may be an e-beam resist for performing an e-beam lithography.

With respect to the resist, exposing is performed by applying shot methods different according to the shot regions, and a developing process is performed, and thus, the first feature is formed.

Next, a pattern is formed in the mask by etching the mask using the first pattern as an etch-mask (S154). The formed mask may be used as a photomask in a photolithography process with respect to a semiconductor substrate.

FIGS. 13A through 13D are cross-sectional views showing formation of features of a pattern on a mask according to an embodiment of the present invention.

Figure 13A:
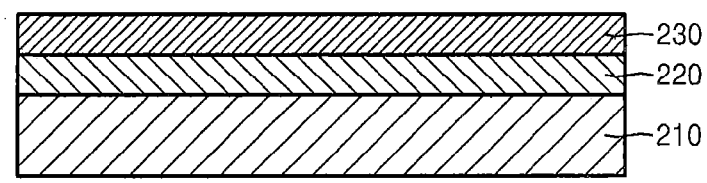
FIGS. 13A through 13D are cross-sectional views illustrating operations of forming a pattern on a mask according to some embodiments of the present inventive concept.

Referring to FIG. 13A, a blank mask in which a metal thin film 220 and a resist film 230 are sequentially formed on a mask substrate 210 is prepared. The mask substrate 210 may be an ordinary quartz substrate. Also, the metal thin film 220 may be, for example, a chrome thin film, and the resist film 230 may be an e-beam resist film for performing an e-beam lithography.

Figure 13B:
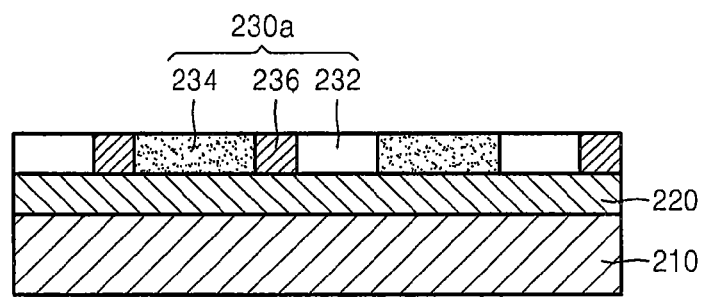

Referring to FIG. 13B, exposing is performed by applying shot methods different according to shot regions. Here, as described above, the shot methods different according to shot regions may denote an overlap shot or shots with different dosages. After exposing, the resist film 230 may be classified as three regions, for example, a first region 232 onto which an e-beam is not irradiated, region onto which an e-beam is irradiated, that is, a second region 234 onto which a single time of e-beam is irradiated, and a region onto which at least two times of e-beam are irradiated, that is, a third region 236 onto which an overlap shot is performed.

Figure 13C:
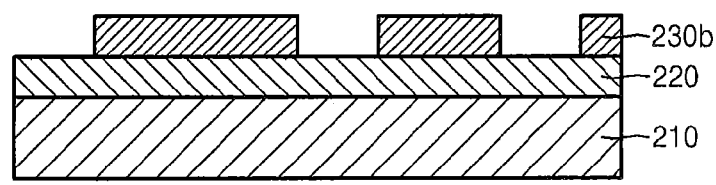

Referring to FIG. 13C, a resist pattern 230b is formed by performing a developing process. In the current embodiment, the regions onto which the e-beam is irradiated remain as the resist pattern 230b. However, in some cases, vice versa. For example, when a laser is used to expose, regions onto which the laser is not irradiated may remain as a pattern according to the material of the resist.

Figure 13D:
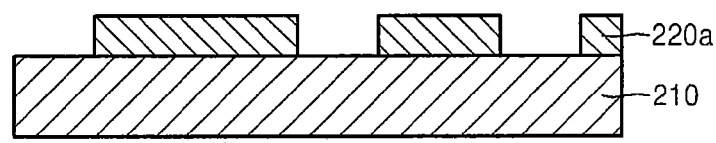

Referring to FIG. 13D, a metal pattern 220a is formed by etching the metal thin film 220 by using the resist pattern 230b as an etch-mask. The forming of a mask, for example, a photomask may be completed by forming the metal pattern 220a on the mask substrate 210.

Figure 14:
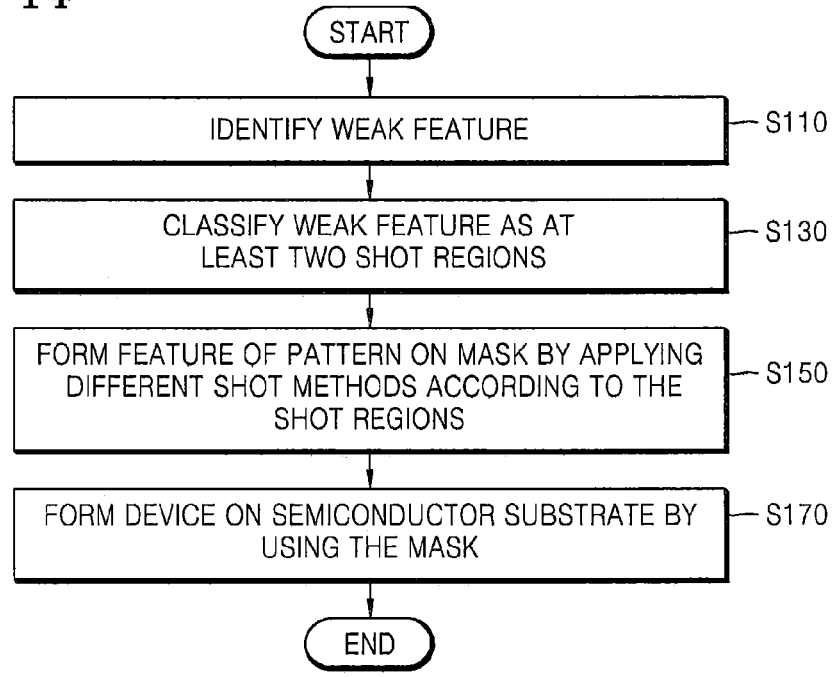
FIG. 14 is a flowchart illustrating methods of fabricating a semiconductor device using the mask fabricated using the patterning method of FIG. 1.

FIG. 14 is a flowchart showing methods of forming a semiconductor device using the mask fabricated according to FIG. 1.

Referring to FIG. 14, first, as in the patterning method described with reference to FIG. 1, weak features are identified (S110), and the weak features are classified as at least two shot regions (S130). A mask pattern, including the features, is formed in a mask by applying shot methods different according to the classified shot regions (S150). Here, the mask may be a photomask that is used for a photolithography process.

After forming the photomask, a device is formed on a semiconductor substrate by using the photomask. More specifically, a first feature is formed in a photoresist on the semiconductor substrate by performing a photolithography process that includes an exposing process by using the photomask and a developing process. Afterwards, a device can be formed by etching a target material layer on the semiconductor substrate by using the first feature as an etch-mask.

Various semiconductor devices may be formed on the semiconductor substrate by repeatedly performing various processes, such as a photolithography process using a photomask, an etching process, a deposition process with respect to material layers or photoresist, and a CMP process or washing process. Also, after forming the semiconductor devices on a semiconductor substrate such as a wafer, the semiconductor devices may be singulated into individual semiconductor devices, and then, the individual semiconductor devices may be packaged, or after packaging on a wafer level, the individual semiconductor devices are singulated into individual packages. In this way, semiconductor devices or semiconductor packages may be fabricated.

Figure 15:
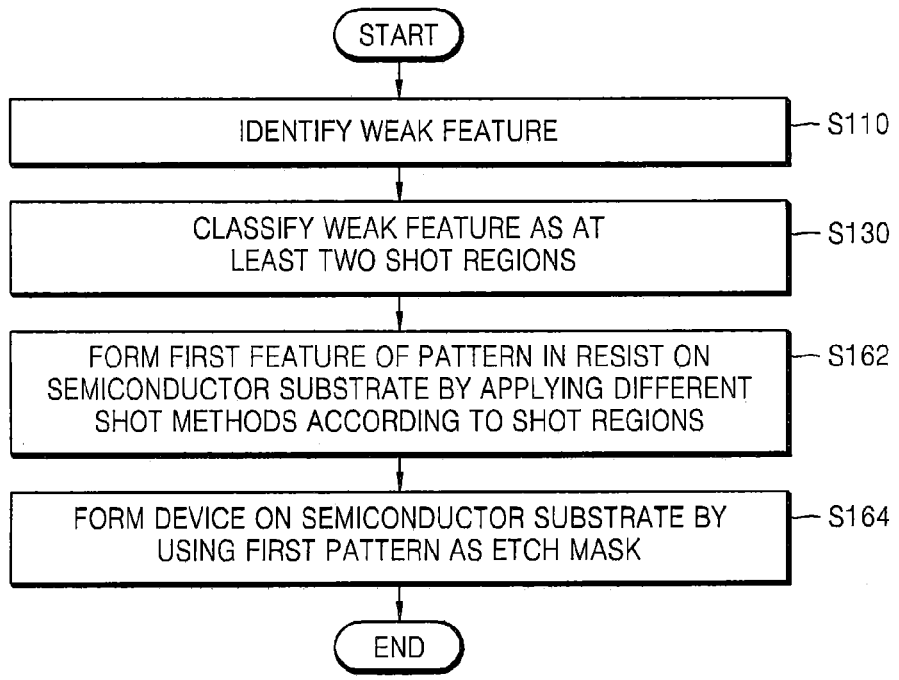
FIG. 15 is a flowchart illustrating operations of forming patterns on a target substrate of FIG. 1 when the target substrate is a semiconductor substrate.

FIG. 15 is a flowchart illustrating formation of a pattern, including features, on a target substrate when the target substrate of FIG. 1 is a semiconductor substrate (S150).

Referring to FIG. 15, as in the patterning method described with reference to FIG. 1, weak features are identified (S110), and the weak features are classified as at least two shot regions (S130). A first feature is formed in a resist on a semiconductor substrate by applying shot methods different according to the classified shot regions (S162). The forming of the first feature in the resist on the semiconductor substrate is similar to the forming of the first feature in the resist on the mask in FIG. 12. However, while an exposure may be performed by using a laser or an e-beam with respect to the resist on the mask, an exposure may be performed by using a laser that is generally used for a photolithography process with respect to the resist on the semiconductor substrate. However, the exposure by using an e-beam is not excluded.

Next, a device can be formed on a semiconductor substrate by using the pattern with the first feature as an etch-mask (S164). The device feature may be formed on a semiconductor substrate or may be formed on a target material layer stacked on a semiconductor substrate.

In the current embodiment, unlike in FIG. 1, a pattern may be directly formed on a semiconductor substrate without using a mask. In this way, a method of forming a pattern directly on a semiconductor substrate without using a mask is referred to as a direct patterning.

Various patterning methods, for example, the methods of patterning described with reference to FIGS. 1 through 3 and 12, and the methods of fabricating a semiconductor device described with reference to, for example, FIGS. 14 and 15 have been described as operations carried out by a semiconductor integration circuit design program, that may be able to be performed by a computer. In this way, some portions or all of the patterning method and the method of fabricating a semiconductor device, according to the current embodiment may be realized by performing the semiconductor integration circuit design program with a computer. Accordingly, the patterning method and the method of fabricating a semiconductor device according to the current embodiment may be realized to a computer readable code in a computer readable recording medium.

Accordingly, aspects of the present disclosure may be implemented entirely hardware, entirely software (including firmware, resident software, micro-code, etc.) or combining software and hardware implementation that may all generally be referred to herein as a "circuit," "controller,", "module," "component," or "system." Furthermore, aspects of the present disclosure may take the form of a computer program product comprising one or more computer readable media having computer readable program code embodied thereon.

Any combination of one or more computer readable media may be used. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, assembly language, dynamic programming languages such as Python, Ruby and Groovy, or other programming languages.

Aspects of the present disclosure are described herein with reference to flowchart illustrations and/or block diagrams of methods, apparatus (systems), and computer program products according to embodiments of the disclosure. It will be understood that each block of the diagrams, and combinations of diagrams, can be implemented by computer program instructions. These computer program instructions may be provided to a controller (or processor) of a general purpose computer, special purpose computer, or other programmable data processing apparatus to produce a machine, such that the instructions, which execute via the processor of the computer or other programmable instruction execution apparatus, create a mechanism for implementing the functions/acts specified in the diagram.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

Figure 16:
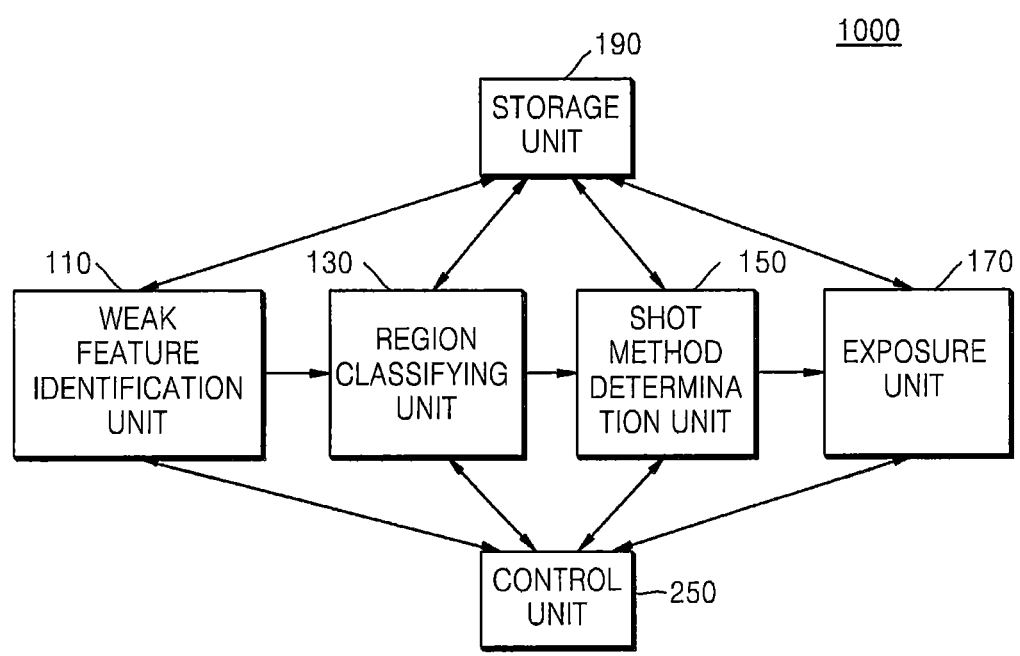
FIG. 16 is a block diagram illustrating a configuration of a semiconductor device manufacturing apparatus according to some embodiments of the present inventive concept.

FIG. 16 is a block diagram illustrating a semiconductor device manufacturing apparatus (or system) 1000 according to some embodiments of the present invention.

Referring to FIG. 16, the semiconductor device manufacturing apparatus 1000 according to the current embodiment may include a weak feature identification unit 110, a region classifying unit 130, a shot method determination unit 150, an exposure unit 170, a storage unit 190, and a control unit 250.

The weak feature identification unit 110 detects weak features having high possibility of causing pattern failure of patterns to be formed on a target substrate through modelling or a predetermined rule. The modelling and the predetermined rule are described with reference to, for example, FIGS. 2 and 3. The region classifying unit 130 classifies the identified weak features as at least two shot regions according to distances between vertexes in the weak features. For example, a weak feature may be classified as a first shot region onto which a single shot is performed and a second shot region onto which at least two shots are performed. Alternatively, the shot regions may be classified according to the number of shots. Also, the shot regions may be classified according to the dosage. The method of classifying shot regions are described with reference to, for example, FIGS. 10A through 10E.

The shot method determination unit 150 determines the method of shots according to the classified shot regions. For example, the shot method determination unit 150 may determine dosage data for the classified regions and data of the number of shots according to each of the shot regions. More specifically, the shot method determination unit 150 may determine to perform a single shot onto the first shot region and to perform at least two shots onto the second shot region. Also, the shot method determination unit 150 may determine to perform a shot with a regular dosage onto the first shot region and to performed shots with a relatively large dosage onto the second shot region.

The exposure unit 170 performs exposing to the classified shot regions by applying different shot methods based on dosage data and a data of number of shots, which are determined by the shot method determination unit 150. The exposure unit 170 may include a laser source or an e-beam apparatus for performing the exposure process. The exposure unit 170 may also include various constituent elements besides the laser source or the e-beam apparatus. For example, when an exposing is performed by using a laser source, the exposure unit 170 may include a projection optical system, an illumination optical system, a plurality of shutters, and a control device. The exposing unit 170 may include a variable shaped beam (VSB) writing mode exposing device. The VSB writing mode exposing device may expose a designed pattern with a unit rectangular shape or a unit triangular shape as a single shot region. Also, the VSB writing mode exposing device may realize both the overlap shot method and the method of shot by controlling a dosage.

The storage unit 190 may store data of modelling or a predetermined rule for identifying a weak feature or data for classifying regions. Also, the storage unit 190 may store and provide data required in the weak feature identification unit 110, the region classifying unit 130, the shot method determination unit 150, the exposure unit 170, and the control unit 250, and also may store results provided by the weak feature identification unit 110, the region classifying unit 130, the shot method determination unit 150, the exposure unit 170, and the control unit 250.

The control unit 250 generally controls the semiconductor device manufacturing apparatus 1000. That is, the control unit 250 may control the weak feature identification unit 110, the region classifying unit 130, the shot method determination unit 150, the exposure unit 170, and the storage unit 190. In the case of the exposure unit 170, a control unit for the exposing unit may be additionally connected to the control unit 250.

A semiconductor device manufacturing apparatus according to some embodiments can identify weak features in patterns to be formed through a weak pattern detection unit, classify the identified weak features as at least two shot regions through a region classifying unit, determine different shot methods for each of the classified shot regions through a shot method determination unit, and perform exposures with the shot methods determined by an exposure unit. Therefore, the semiconductor device manufacturing apparatus may reduce pattern failures while maintaining a process stability.

While the inventive concept has been particularly shown and described with reference to exemplary embodiments thereof, it will be understood that various changes in form and details may be made therein without departing from the spirit and scope of the following claims.

What is claimed:

1. A semiconductor device manufacturing apparatus comprising:
    a weak feature identification unit configured to identify weak features from among a plurality of features included in a photolithography pattern to be formed on a mask or a substrate, wherein each weak feature comprises a respective portion of the photolithography pattern that is determined to have a respective probability, of causing the photolithography pattern to fail, that is greater than a reference value;
    a region classification unit configured to classify each of the weak features to include respective first and second regions;
    a shot method determination unit configured to determine respective first and second dosages to be applied to the first and second regions, respectively; and
    an exposure unit configured to expose the first and second regions with the first and second dosages, wherein the weak feature identification unit is further configured to identify a feature as the weak feature when a distance between a vertex of the feature and another feature of the pattern is within a predetermined range or when a number of vertexes included in a unit area of the pattern is greater than a predetermined number.

2. The apparatus of claim 1 wherein the shot method determination unit is configured to determine the first and second dosages and the exposure unit is configured to expose the first and second regions using the first and second dosages.

3. The apparatus of claim 1 wherein the exposure unit comprises a laser light source or an e-beam source.

4. The apparatus of claim 1 further comprising:
    a storage unit configured to store data of modeling or a predetermined rule configured for use by the weak feature identification unit.

5. The apparatus of claim 4 wherein the weak feature identification unit is configured to identify the feature as the weak feature when the distance between the vertex of the feature and another feature of the pattern is within the predetermined range and when the number of vertexes included in a unit area of the pattern is greater than the predetermined number.

6. The apparatus of claim 1 wherein the region classification unit is further configured to classify the first region to include all of the weak feature as the first dosage region and configured to classify the second region to include directly adjacent first and second vertices as the second dosage region so that at least some portion of the first region is non-overlapping with the second region based on the comparison to the reference value.

7. The apparatus of claim 1 wherein the region classification unit is further configured to classify the first region to include all of the weak feature as the first region and configured to classify the second region to include all of the weak feature as the second region so that the first region completely overlaps the second region based on the comparison to the reference value.

8. The apparatus of claim 1 wherein the region classification unit is further configured to classify the first region of the weak feature as a first e-beam exposure region and classify the second region of the weak feature as a second e-beam exposure region to receive a greater e-beam dosage than the first region.

* * * * *